US011251027B2

(12) United States Patent
Hatano et al.

(10) Patent No.: US 11,251,027 B2
(45) Date of Patent: Feb. 15, 2022

(54) STAGE DEVICE AND PROCESSING APPARATUS

(71) Applicant: TOKYO ELECTRON LIMITED, Tokyo (JP)

(72) Inventors: Tatsuo Hatano, Nirasaki (JP); Naoki Watanabe, Nirasaki (JP); Koji Maeda, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/881,693

(22) Filed: May 22, 2020

(65) Prior Publication Data

US 2020/0373133 A1 Nov. 26, 2020

(30) Foreign Application Priority Data

May 23, 2019 (JP) .............................. JP2019-096587

(51) Int. Cl.
| | |
|---|---|
| *H01J 37/32* | (2006.01) |
| *H01L 21/687* | (2006.01) |
| *H01J 37/34* | (2006.01) |
| *C23C 14/34* | (2006.01) |
| *C23C 14/50* | (2006.01) |
| *H01L 43/12* | (2006.01) |

(52) U.S. Cl.
CPC ........ *H01J 37/32724* (2013.01); *C23C 14/34* (2013.01); *C23C 14/505* (2013.01); *H01J 37/3417* (2013.01); *H01J 37/3426* (2013.01); *H01L 21/68764* (2013.01); *H01L 43/12* (2013.01); *H01J 2237/002* (2013.01); *H01J 2237/20214* (2013.01); *H01J 2237/332* (2013.01)

(58) Field of Classification Search
None
See application file for complete search history.

(56) References Cited

U.S. PATENT DOCUMENTS

| | | | |
|---|---|---|---|
| 2008/0203925 A1* | 8/2008 | Tandou | H01L 21/67109 315/111.21 |
| 2016/0071707 A1* | 3/2016 | Furukawa | H01J 37/32715 204/298.09 |
| 2017/0110298 A1* | 4/2017 | Ricci | C23C 16/4586 |
| 2017/0198395 A1* | 7/2017 | Nozawa | H01L 21/67069 |

FOREIGN PATENT DOCUMENTS

| | | |
|---|---|---|
| JP | 2016-053202 A | 4/2016 |
| JP | 2019-16771 A | 1/2019 |
| KR | 10-2018-0135040 A | 12/2018 |

* cited by examiner

*Primary Examiner* — Jason Berman
(74) *Attorney, Agent, or Firm* — Fenwick & West LLP

(57) ABSTRACT

A stage device for holding a substrate in a processing apparatus for processing the substrate includes a stage, a stage rotating mechanism, and a cold heat transfer mechanism. The stage is configured to hold the substrate in a processing chamber. The stage rotating mechanism includes a rotation shaft extending downward from a center of a bottom surface of the stage and a motor configured to rotate the stage via the rotation shaft. The cold heat transfer mechanism includes at least one cold heat transfer body that is fixedly disposed at a position spaced away from the rotation shaft below the stage and is configured to transfer cold heat of a chiller. The cold heat transfer mechanism is disposed with a gap between the cold heat transfer mechanism and the stage.

12 Claims, 7 Drawing Sheets

STAGE DEVICE AND PROCESSING APPARATUS

CROSS-REFERENCE TO RELATED APPLICATIONS

This application claims priority to Japanese Patent Application No. 2019-096587, filed on May 23, 2019, the entire contents of which are incorporated herein by reference.

TECHNICAL FIELD

The present disclosure relates to a stage device and a processing apparatus.

BACKGROUND

There is an apparatus for processing a substrate, e.g., a semiconductor substrate or the like, such as a film forming apparatus that performs a process that requires to be performed at an extremely low temperature, for example. For example, there is known a technique for forming a magnetic film in an ultra-high vacuum environment and an extremely low temperature environment to obtain a magneto-resistance element having a high magneto-resistance ratio.

As an example of a technique for uniformly cooling a substrate to an extremely low temperature in an ultra-high vacuum environment, there is known a technique (e.g., Japanese Patent Application Publication No. 2019-016771) in which a stage for mounting thereon a substrate is rotatably disposed and a cold heat transfer body is disposed at a center of a bottom surface of the stage with a gap between the cold heat transfer body and the bottom surface of the stage. This technique uniformly cools the substrate to an extremely low temperature by supplying a cooling gas to the gap between the rotating stage and the cold heat transfer body and transferring cold heat from a chiller to the stage through the cold heat transfer body.

The present disclosure provides a stage device capable of rotating a substrate in a state where the substrate is cooled to an extremely low temperature and realizing the scaling down of the stage device size while ensuring ease of maintenance, and a processing apparatus including the stage device.

SUMMARY

In accordance with an aspect of the present disclosure, there is provided a stage device for holding a substrate in a processing apparatus for processing the substrate, including: a stage configured to hold the substrate in a processing chamber; a stage rotating mechanism including a rotation shaft extending downward from a center of a bottom surface of the stage and a motor configured to rotate the stage via the rotation shaft; and a cold heat transfer mechanism including at least one cold heat transfer body that is fixedly disposed at a position spaced away from the rotation shaft below the stage and configured to transfer cold heat of a chiller, the cold heat transfer mechanism being disposed with a gap between the cold heat transfer mechanism and the stage.

BRIEF DESCRIPTION OF THE DRAWINGS

The objects and features of the present disclosure will become apparent from the following description of embodiments, given in conjunction with the accompanying drawings, in which.

DETAILED DESCRIPTION

Hereinafter, embodiments will be described in detail with reference to the accompanying drawings.

First Embodiment

Figure 1:
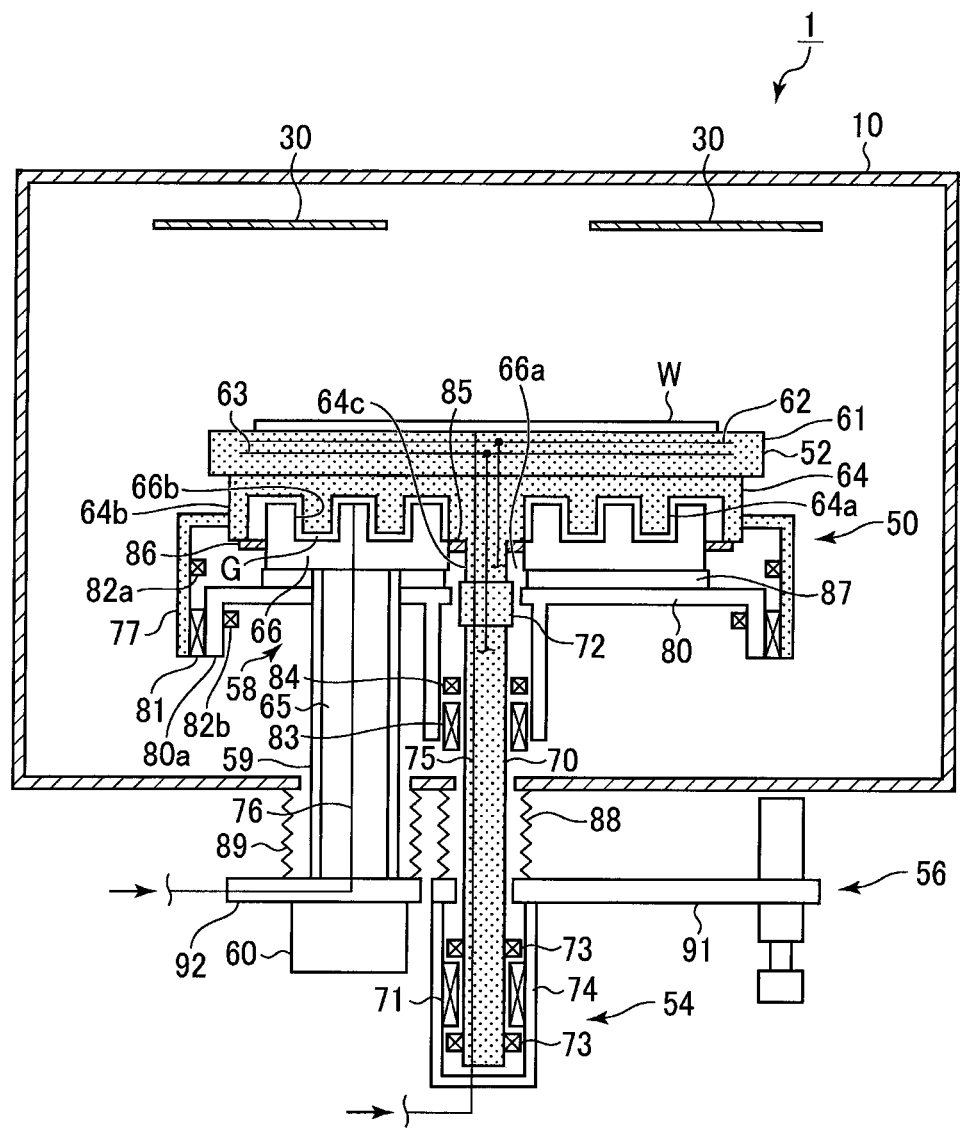
FIG. 1 is a schematic cross-sectional view showing an example of a processing apparatus including a stage device according to a first embodiment.
Figure 2:
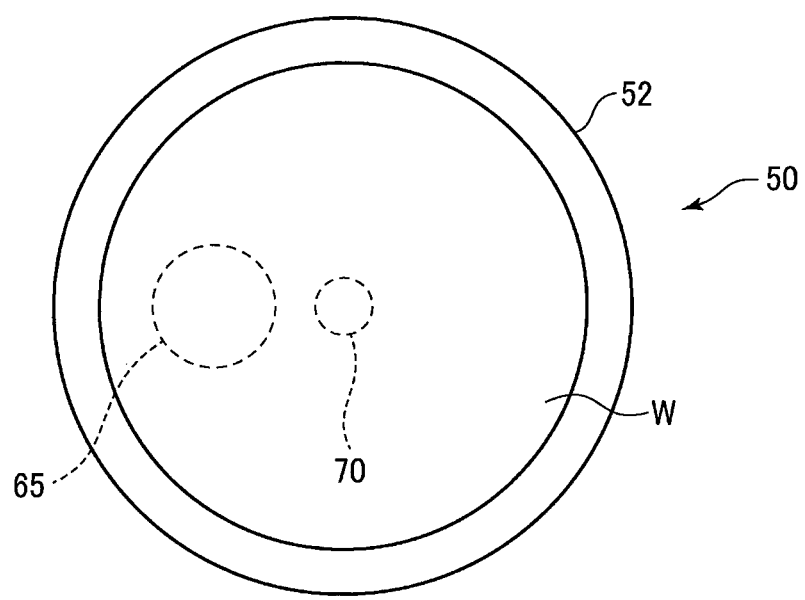
FIG. 2 is a plan view showing an example of the stage device according to the first embodiment.

First, a first embodiment will be described.
(Processing Apparatus)
An example of a processing apparatus including a stage device according to the first embodiment will be described. FIG. 1 is a schematic cross-sectional view showing an example of the processing apparatus. FIG. 2 is a plan view showing an example of the stage device according to the first embodiment.

As shown in FIG. 1, a processing apparatus 1 includes a processing chamber 10 that can be maintained in a vacuum state, a target 30, and a stage device 50.

The processing apparatus 1 is configured as a film forming apparatus capable of forming a magnetic film by sputtering on a semiconductor wafer (hereinafter, simply referred to as "wafer") W that is a target substrate in an environment of ultra-high vacuum and an extremely low temperature in the processing chamber 10. The magnetic film is used for, e.g., a tunneling magnetoresistance (TMR) element.

The processing chamber 10 is configured to process the wafer W that is the substrate. The processing chamber 10 is connected to a gas exhaust unit (not shown) such as a vacuum pump capable of depressurizing the inside of the processing chamber 10 to an ultra-high vacuum (e.g., $10^{-5}$ Pa or less). A gas supply line (not shown) is connected from the outside to the processing chamber 10. A sputtering gas for sputtering film formation (e.g., nitrogen gas or noble gas such as argon (Ar) gas, krypton (Kr) gas, neon (Ne) gas or the like) is supplied through the gas supply line. A loading/unloading port (not shown) for the wafer W is formed at a sidewall of the vacuum chamber 10, and can be opened and closed by a gate valve (not shown).

The target 30 is disposed at an upper portion of the processing chamber 10 to face the wafer W held on the stage device 50. An AC voltage or a DC voltage is applied from a plasma generation power supply (not shown) to the target 30. When the AC voltage or the DC voltage is applied from the plasma generation power supply to the target 30 in a state where the sputtering gas is introduced into the processing chamber 10, plasma of the sputtering gas is generated in the processing chamber 10 and the target 30 is sputtered by ions in the plasma. Atoms or molecules of the sputtered target material are deposited on the surface of the wafer W held on the stage device 50. Although the number of targets 30 is not particularly limited, it is preferred to provide a plurality of targets 30 so that films of different materials can be formed by one processing apparatus 1. For example, in the case of depositing a magnetic film (film containing a ferromagnetic material such as Ni, Fe, Co, or the like), the target 30 may be made of, e.g., CoFe, FeNi, NiFeCo, or the like. Alternatively, the target 30 may be made of other materials in addition to those materials.

<Stage Device>

Next, the stage device 50 will be described in detail.

The stage device 50 holds the wafer W on the stage 52 and cools the wafer W to an extremely low temperature through the stage 52 while rotating the stage 52 together with the wafer W.

As shown in FIG. 1, the stage device 50 includes a stage 52, a stage rotating mechanism 54, a stage elevating mechanism 56, a cold heat transfer mechanism 58, and a chiller 60.

The stage 52 has a disk-shaped main body, an electrostatic chuck 61 disposed at an upper portion of the main body, and a first heat transfer unit 64 disposed on a bottom surface of the main body. The main body and the first heat transfer unit 64 of the stage 52 are made of a material having high thermal conductivity, e.g., pure copper (Cu) or the like. The electrostatic chuck 61 has a dielectric film, and a chuck electrode 62 is embedded therein. The chuck electrode 62 is connected to a DC power supply (not shown) through a wiring. By applying a DC voltage to the chuck electrode 62, the wafer W is electrostatically attracted and held on the electrostatic chuck 61. Further, a heater 63 is embedded in the stage 52. The heater 63 is connected to a heater power supply (not shown) through a wiring. The heater 63 is configured to heat the stage 52 by power supplied thereto. Protrusions 64a are formed on a bottom surface of the first heat transfer unit 64 to be concentric about the center of the stage 52. The first heat transfer unit 64 has a cylindrical portion 64b at an outermost periphery thereof. The stage 52 is provided with a temperature sensor (not shown) for measuring the temperature of the stage 52.

The stage rotating mechanism 54 is configured to rotate the stage 52. The stage rotating mechanism 54 includes a rotation shaft 70 extending downward from the center of the bottom surface of the stage 52, and a motor 71 for rotating the stage 52 via the rotation shaft 70. The rotation shaft 70 is connected to a projecting portion 64c projecting downward from the center of the bottom surface of the first heat transfer unit 64 via an insulating member 72. The motor 71 is a direct driving motor that directly drives the rotation shaft 70 without using a speed reduction mechanism or the like. Bearings 73 for the rotation shaft 70 are disposed above and below the motor 71. A driving unit including, e.g., the motor 71, the bearings 73, and the like is accommodated in a housing 74.

A heat transfer gas channel 75 for supplying a heat transfer gas to the backside of the wafer W is formed in the rotation shaft 70. The heat transfer gas channel 75 extends up to the surface of the stage 52 via the insulating member 72 and the stage 52. The heat transfer gas is supplied from a gas supply source (not shown) to the backside of the wafer W through the heat transfer gas channel 75. It is preferred to use He gas having high thermal conductivity as the heat transfer gas. Further, wirings for the chuck electrode 62 and the heater are disposed in the rotation shaft 70.

The stage elevating mechanism 56 is configured to move the stage 52 via a plate 91 between a transfer position where the wafer W is mounted on the stage 52 and a processing position where film formation is performed on the wafer W mounted on the stage 52. The transfer position is set to be lower than the processing position. The distance between the target 30 and the wafer W can be controlled by the stage elevating mechanism 56.

The cold heat transfer mechanism 58 is configured to transfer cold heat from the chiller 60 to the stage 52. The cold heat transfer mechanism 58 and the stage 52 are disposed with a gap therebetween. The cold heat transfer mechanism 58 includes a cold heat transfer body 65 and a second heat transfer unit (stage-side heat transfer unit) 66. As shown in FIG. 2, the cold heat transfer body 65 has a columnar shape and is fixedly disposed below the stage 52 to be eccentric outward from the rotation shaft 70 (that is, the cold heat transfer body 65 is fixedly disposed at a position spaced away from the rotation shaft 70 below the stage 52). The second heat transfer unit 66 is connected onto the cold heat transfer body 65 and transfers the cold heat that has reached the cold heat transfer body 65 to the stage 52 via the cooling gas supplied to the gap. The cold heat transfer body 65 and the second heat transfer unit 66 are made of a material having high thermal conductivity, e.g., pure copper (Cu) or the like, to efficiently transfer the cold heat of the chiller 60. The chiller 60 may function as at least a part of a cooling fluid supply mechanism.

The chiller 60 is attached to a base plate 92. The chiller 60 supports the cold heat transfer body 65 and cools the cold heat transfer body 65. The chiller 60 cools an upper surface of the cold heat transfer mechanism 58 (i.e., the upper surface of the second heat transfer unit 66) to an extremely low temperature (e.g., −20° C. or lower). The chiller 60 has a cold head at an upper portion thereof, and cold heat is transferred from the cold head to the cold heat transfer body 65. The chiller 60 preferably uses Gifford-McMahon (GM) cycle in view of cooling performance. In the case of forming a magnetic film used for a TMR element, the temperature for cooling the stage 52 by the chiller 60 through the cold heat transfer mechanism 58 is preferred to be in a range from −23° C. to −223° C. (250K to 50K).

In addition, a heating mode can be performed by driving the cooling cycle of the chiller 60 in reverse order. By setting the chiller 60 to the heating mode during maintenance or the like, it is possible to heat the stage 52 to a room temperature through the cold heat transfer mechanism 58. At this time, the temperature of the stage 52 can be more quickly returned to the room temperature by heating the stage 52 with the heater 63.

A heat insulating structure 59 is disposed at an outer periphery of the cold heat transfer body 65. The heat insulating structure 59 has, e.g., a vacuum insulated structure (double-walled vacuum pipe structure) inside of which is maintained in a vacuum state. With the heat insulating structure 59, it is possible to suppress the deterioration of the cooling performance of the cold heat transfer body 65.

The second heat transfer unit 66 of the cold heat transfer mechanism 58 is disposed to correspond to the stage 52 (the first heat transfer unit 64) and has a substantially annular shape having at the center thereof a hole 66a through which the rotation shaft 70 is inserted. The second heat transfer unit 66 has substantially the same size as that of the first heat transfer unit 64. Specifically, the second heat transfer unit 66 is slightly smaller than the first heat transfer unit 64. An upper surface of the second heat transfer unit 66 has an uneven (concave-convex pattern) pattern corresponding to an uneven pattern of the first heat transfer unit 64, and the uneven patterns are disposed with a gap therebetween. In other words, recesses 66b are concentrically formed at the second heat transfer unit 66 to correspond to the concentrically formed protrusions 64a of the first heat transfer unit 64. The protrusions 64a and the recesses 66b are fitted with a gap G of, e.g., 2 mm or less, therebetween, thereby forming a comb-teeth shaped heat exchange portion.

A cooling gas supply line 76 through which a cooling gas flows is formed through the center of the cold heat transfer body 65. The cooling gas supply line 76 extends while penetrating through the second heat transfer unit 66. Then, the cooling gas from a gas supply source (not shown) is supplied to the gap G through the cooling gas supply line 76. The cold heat of the chiller 60 is transferred to the stage through the cold heat transfer mechanism 58 and the cooling gas, and the stage 52 is cooled to an extremely low temperature. Since the stage 52 is cooled through the cooling gas, it is possible to rotate the stage 52.

At this time, the gap G is bent in the comb-teeth shape, the heat transfer efficiency of the cooling gas between the first heat transfer unit 64 and the second heat transfer unit 66 can be improved. The shapes and the numbers of the protrusions 64a and the recesses 66b are appropriately set such that appropriate heat exchange can be performed. The height of the recesses 66b may be the same as the height of the protrusions 64a and may be set to be, e.g., in a range from 40 mm to 50 mm. The width of the recesses 66b may be slightly greater than the width of the protrusions 64a and may be set to be, e.g., in a range from 7 mm to 9 mm.

The protrusion 64a and the recess 66b may have corrugated shapes corresponding to each other. Each of the surfaces of the protrusion 64a and the recess 66a may have an uneven pattern by blasting or the like. Accordingly, the surface area for the heat transfer can be increased, and the heat transfer efficiency can be further improved.

The cooling of the stage 52 while being rotated may be performed using a liquid coolant, such as antifreeze liquid, other than the cooling gas. Alternatively, the gap G may be filled with thermal grease having good thermal conductivity.

The cold heat transfer body 65 and the second heat transfer unit 66 of the cold heat transfer mechanism 58 may be formed as one unit, or may be formed separately and adhered to each other.

The cold heat transfer mechanism 58 is supported by a fixed frame 80. Further, a cylindrical cover member 77 extending downward is attached to an outer lower end portion of the cylindrical portion 64b of the first heat transfer unit 64. The cover member 77 is rotated by the rotation of the stage 52. The cover member 77 is disposed to cover the second heat transfer unit 66 and the upper portion of the cold heat transfer body 65.

The fixed frame 80 has a cylindrical portion 80a facing an inner surface of the cover member 77, and a magnetic fluid seal 81 is disposed between the rotatable cover member 77 and the cylindrical portion 80a of the fixed frame 80. Heaters 82a and 82b for heating the magnetic fluid seal 81 are disposed near the magnetic fluid seal 81. Further, a magnetic fluid seal 83 is disposed between the rotation shaft 70 and the fixed frame 80, and a heater 84 for heating the magnetic fluid seal 83 is disposed near the magnetic fluid seal 83. The stage 52 can be rotated via the rotation shaft 70 in a state where a gap between the cover member 77 and the fixed frame 80 and a gap between the rotating shaft 70 and the fixed frame 80 are hermetically sealed with the magnetic fluid seals 81 and 83. Further, the magnetic fluid seals 81 and 83 can be heated by the heaters 82a, 82b, and 84, so that it is possible to suppress the deterioration of the sealing performance and the occurrence of condensation due to the decrease in the temperature of the magnetic fluid.

A sealing member 85 is disposed between the second heat transfer unit 66 and the projecting portion 64c of the first heat transfer unit 64 and a sealing member 86 is disposed between the second heat transfer unit 66 and the cylindrical portion 64b of the first heat transfer unit 64. The sealing members 85 and 86 prevent the cooling gas from leaking from the gap G.

Further, a heat insulating member 87 is disposed on the bottom surface of the second heat transfer unit 66, so that the release of cold heat from the second heat transfer unit 66 is suppressed.

A bellows 88 having a metal bellows structure that can be expanded and contracted in a vertical direction is disposed between the plate 91 and a bottom surface of the processing chamber 10. A bellows 89 is disposed between the base plate 92 and the bottom surface of the processing chamber 10. The bellows 88 and 89 have a function of separating the vacuum space communicating with the processing chamber 10 from the space of an atmospheric atmosphere.

In FIG. 1, the members rotated by the stage rotating mechanism 54 and the rotation shaft 60 are illustrated with dots for the sake of convenience.

<Operations of the Processing Apparatus and the Stage Device>

In the processing apparatus 1, the chiller 60 of the stage device 50 operates in a state where the processing chamber 10 is evacuated to be in a vacuum state. A cooling gas (e.g., He gas) is supplied to the gap G through the cooling gas supply line 76. Accordingly, the stage 52 is maintained at an extremely low temperature of −20° C. or lower by the cold heat transferred from the chiller 60 maintained at an extremely low temperature to the cold heat transfer mechanism 58. More specifically, the cold heat transferred from the chiller 60 to the second heat transfer unit 66 through the cold heat transfer body 65 is transferred to the stage 52 through the cooling gas in the gap G, and the stage 52 is maintained at the extremely low temperature of 20° C. or less.

Then, the stage 52 is moved (lowered) to the transfer position by the stage elevating mechanism 56, and the wafer W is transferred from a vacuum transfer chamber (not shown) into the processing chamber 10 by a transfer device (not shown) and mounted on the stage 52. Next, a DC voltage is applied to the chuck electrode 62, and the wafer W is electrostatically attracted and held on the electrostatic chuck 61. Then, a heat transfer gas (e.g., He gas) is supplied to the backside of the wafer W through the heat transfer gas channel 75, and the wafer W as well as the stage 52 is also maintained at the extremely low temperature of −20° C. or lower.

Thereafter, the stage 52 is raised to the processing position, and the film formation is performed while rotating the stage 52 maintained at the extremely low temperature.

The technique for transferring the cold heat of the chiller through the cold heat transfer body and cooling the stage while rotating the stage through the cooling gas supplied to the gap between the cold heat transfer body and the stage is disclosed in Japanese Patent Application Publication No. 2019-016771.

However, in the technique disclosed in the above Publication, the cold heat transfer body is disposed at the center of the stage, and the stage rotating mechanism is disposed to surround the cold heat transfer body, so that the stage rotating mechanism has a large size and the motor is scaled up. Further, the chiller cannot be disposed near the stage due to the presence of the stage rotating mechanism, so that the cold heat transfer body is scaled up (lengthened) and a chiller having a large size is required. In addition, since the stage rotating mechanism is disposed to surround the cold heat transfer member, it is difficult to perform maintenance.

On the other hand, in the present embodiment, the rotation shaft 70 extends downward from the center of the bottom surface of the stage 52, and the stage is rotated by the motor 71 via the rotation shaft 70. Further, the cold heat transfer body 65 is disposed at a position spaced away from the rotation shaft 70 below the stage 52.

Therefore, the rotation shaft 70 can be disposed at the center of the stage 52 and the motor 71 can be disposed near the rotation shaft 70 without considering the position of the cold heat transfer body 65. Accordingly, it is possible to use a small motor 71. Further, since the stage rotating mechanism 54 and the cold heat transfer body 65 are separated from each other, the chiller 60 can be disposed at a desired position without considering the position of the stage rotating mechanism 54. Thus, the chiller 60 can be disposed at a position above the motor 71, and the length of the cold heat transfer body 65 can be shortened. Since the length of the cold heat transfer body 65 can be shortened, the chiller 60 can also be scaled down in size. Accordingly, the entire stage device 50 can be scaled down in size. In addition, since the stage rotating mechanism 54 and the cold heat transfer body 65 are separated from each other, the components of each of the stage rotating mechanism 54 and the cold heat transfer mechanism 58 can be easily attached and detached. Therefore, it becomes easy to perform maintenance.

When the cold heat transfer body 65 is disposed at the center of the stage 52 as disclosed in the Publication No. 2019-016771, the temperature distribution of the cold heat transfer body 65 and the second heat transfer unit 66 is likely to be directly transferred to the stage 52 and the wafer W, which may result in concentric temperature distribution. On the other hand, in the present embodiment, since the cold heat transfer body 65 is disposed at a position eccentric from the center of the stage 52, the temperature distribution becomes uniform by the rotation of the stage 52, which results in the uniform temperature distribution of the stage 52 and the wafer W.

In the present embodiment, since the cold heat transfer mechanism 58 has the second heat transfer unit 66 disposed to correspond to the stage 52, the heat exchange between the cold heat transfer mechanism 58 and the stage 52 through the cooling gas is improved so that the stage 52 can be efficiently cooled. Particularly, the protrusions 64a of the first heat transfer unit 64 of the stage 52 and the recesses 66b of the second heat transfer unit 66 of the cold heat transfer mechanism 58 form a comb-teeth shaped heat exchange portion. Since the cooling gas is supplied to the bent gap G, the cooling efficiency can be further improved.

Further, since the cold heat transfer body 65 can be scaled down in size (shortened), it is possible to quickly return the temperature of the stage 52 to the room temperature through the cold heat transfer mechanism 58 by setting the chiller 60 to the heating mode during maintenance and, thus, the time required for the maintenance can be reduced. In addition, since the stage 52 can be directly heated by the heater 63, the time required for the maintenance can be further reduced.

Second Embodiment

Next, a second embodiment will be described.

Figure 3:
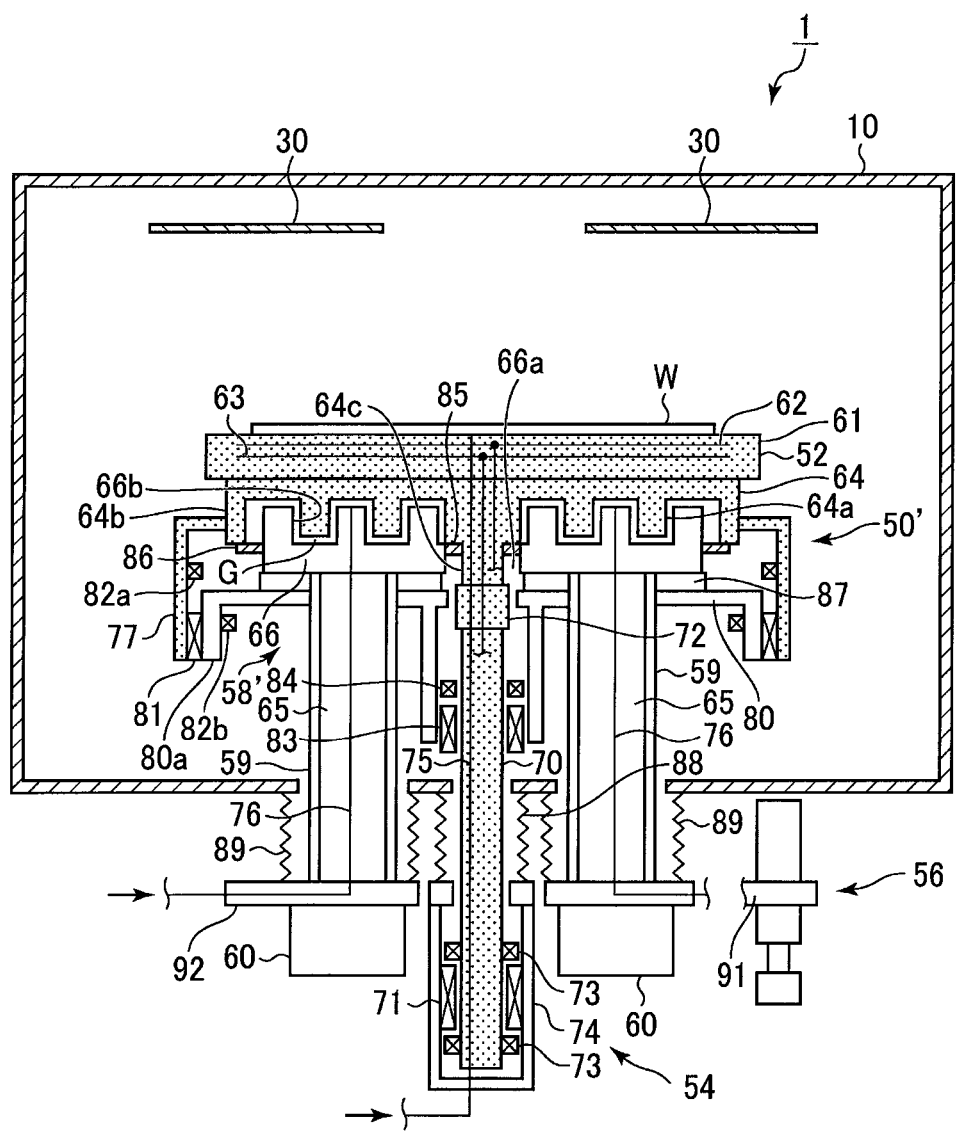
FIG. 3 is a schematic cross-sectional view showing an example of a processing apparatus including a stage device according to a second embodiment.
Figure 4:
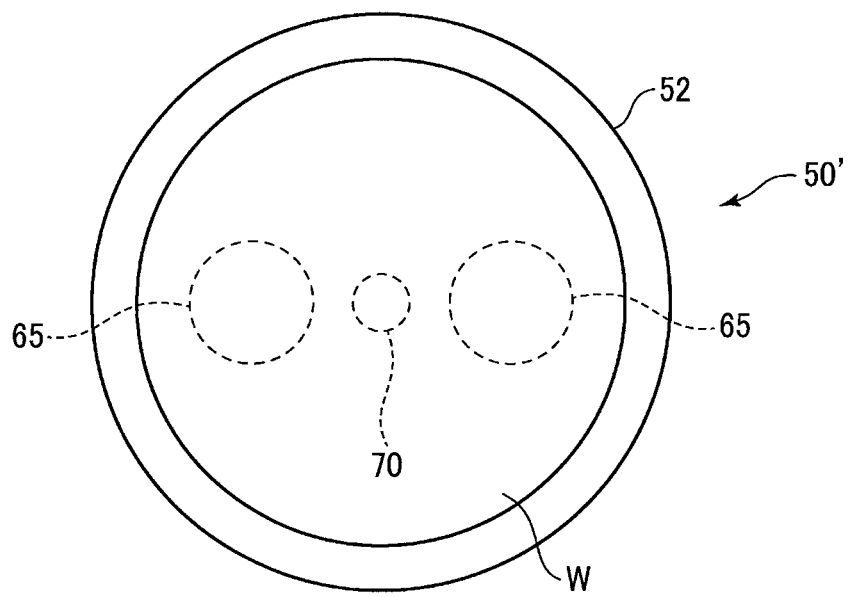
FIG. 4 is a plan view showing an example of the stage device according to the second embodiment.

FIG. 3 is a schematic cross-sectional view showing an example of a processing apparatus including a stage device according to the second embodiment. FIG. 4 is a plan view showing an example of the stage device according to the second embodiment.

A stage device 50' of the present embodiment has a cold heat transfer mechanism 58' in which a plurality of (two in this example) cold heat transfer bodies 65 are connected to the second heat transfer unit 66, instead of the cold heat transfer mechanism 58 of the first embodiment. Further, a plurality of chillers 60 are disposed to respectively correspond to the plurality of cold heat transfer bodies 65. However, a common chiller may be provided for the plurality of cold heat transfer bodies 65. The other configurations of the stage device 50' are the same as those of the stage device 50 of the first embodiment.

In the present embodiment, since the cold heat transfer mechanism 58' has the plurality of columnar cold heat transfer bodies 65 below the stage 52, the footprint is not increased compared to that in the case of using the cold heat transfer mechanism 58 of the first embodiment. Therefore, the stage device 50' can be scaled down in size similar to the stage device 50 of the first embodiment. Further, the maintenance is still easy even with the plurality of cold heat transfer bodies 65. Accordingly, in accordance with the stage device 50' of the present embodiment, while the scaling down of the stage device 50' and ease of maintenance are ensured, the cooling effect of the stage 52 can be enhanced by the increasing number of the cold heat transfer bodies 65.

Especially, in the case of cooling the stage 52 to an extremely low temperature of −23° C. to −223° C. (250K to 50K) through the cooling gas as in the present embodiment, it is effective to enhance the cooling by arranging the plurality of columnar cold heat transfer bodies 65.

Figure 5:
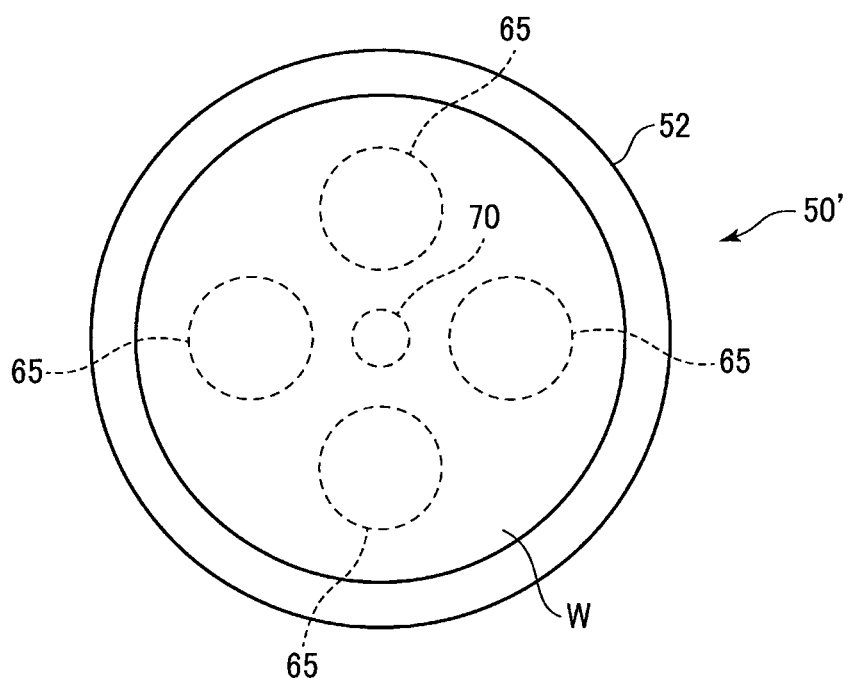
FIG. 5 is a plan view showing another example of the stage device according to the second embodiment.
Figure 6:
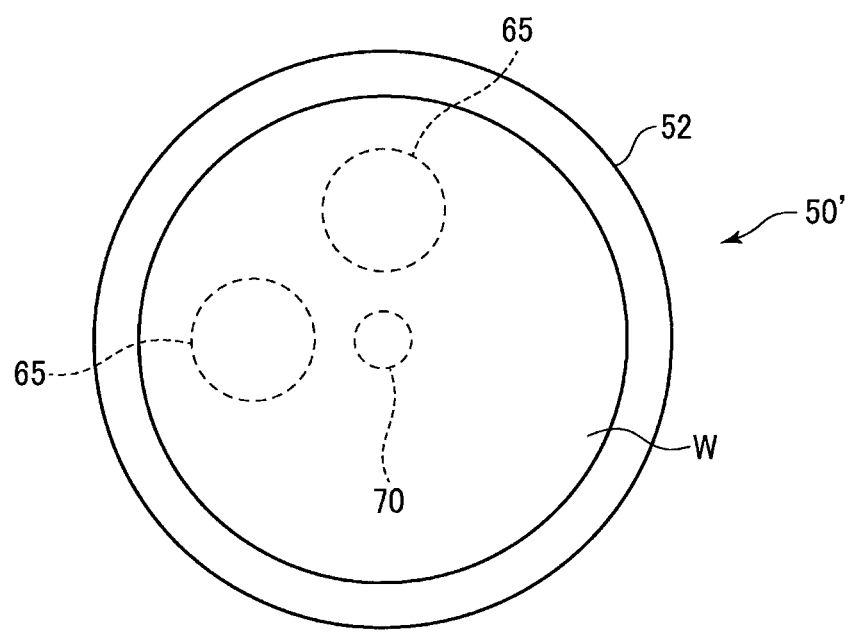
FIG. 6 is a plan view showing still another example of the stage device according to the second embodiment.

In FIG. 4, the cold heat transfer mechanism 58' has two columnar cold heat transfer bodies 65. However, in the present embodiment, the number of the columnar cold heat transfer bodies 65 is not particularly limited and may vary as long as they can be arranged below the stage 52. FIG. 5 shows an example in which four cold heat transfer bodies 65 are arranged. In FIGS. 4 and 5, the cold heat transfer bodies 65 are arranged uniformly. However, as shown in FIG. 6, the cold heat transfer bodies 65 may be non-uniformly arranged.

Third Embodiment

Next, a third embodiment will be described.

Figure 7:
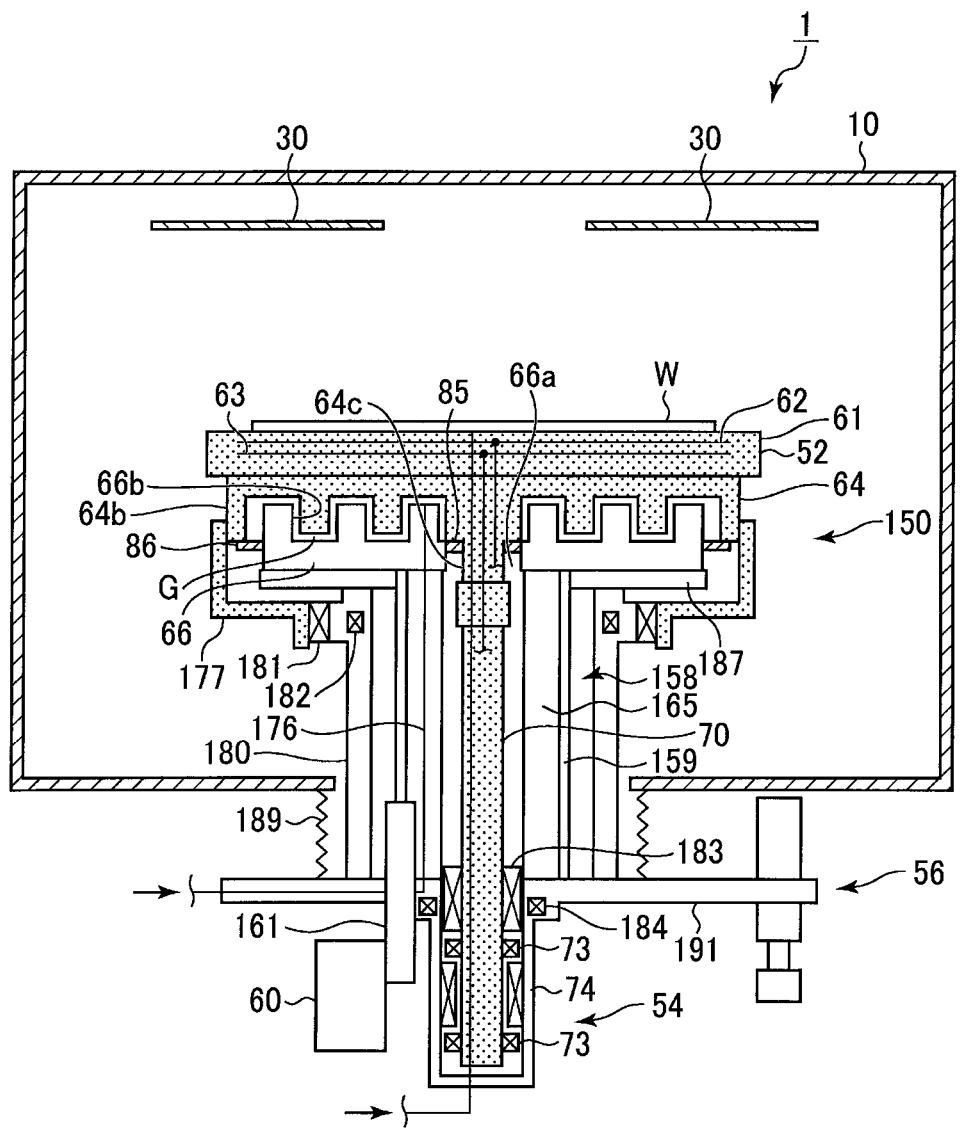
FIG. 7 is a schematic cross-sectional view showing an example of a processing apparatus including a stage device according to a third embodiment.
Figure 8:
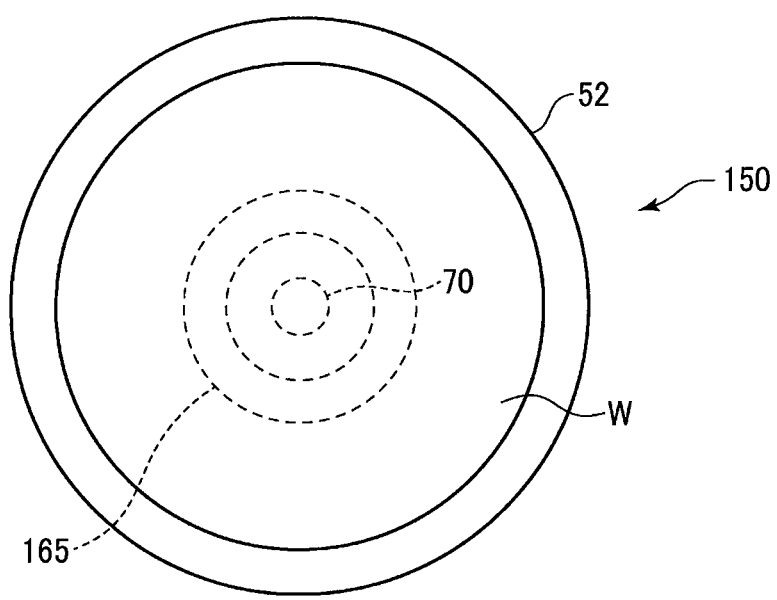
FIG. 8 is a plan view showing an example of the stage device according to the third embodiment.

FIG. 7 is a schematic cross-sectional view showing an example of a processing apparatus including a stage device according to the third embodiment. FIG. 8 is a plan view showing an example of the stage device according to the third embodiment.

A stage device 150 of the present embodiment has, instead of the cold heat transfer mechanism 58 of the first embodiment, a cold heat transfer mechanism 158 including a cylindrical cold heat transfer body 165 and having a structure in which the cold heat transfer body 165 is connected to the second heat transfer unit 66. The cold heat transfer body 165 is fixedly disposed to surround the rotation shaft 70 and is made of a material having high thermal conductivity such as pure copper (Cu), similar to the cold heat transfer body 65.

The cold heat transfer body 165 is connected to the chiller 60 that is similar to that of the first embodiment through a connection member 161 made of a material having high thermal conductivity such as pure copper (Cu) or the like. The connection member 161 is supported by a base plate 191.

A cooling gas supply line 176 through which a cooling gas flows is formed in the cold heat transfer body 165. The cooling gas supply line 176 extends through the second heat transfer unit 66. The cooling gas supplied from a gas supply source (not shown) is supplied to the gap G through the cooling gas supply line 176. The cold heat of the chiller 60 is transferred to the stage 52 through the cold heat transfer mechanism 158 and the cooling gas, so that the stage 52 is cooled to an extremely low temperature.

The cold heat transfer mechanism 158 is supported by a fixed frame 180. Further, a cylindrical cover member 177 extending downward and having a stepped portion is attached to an outer lower end portion of the cylindrical portion 64b of the first heat transfer unit 64. The cover member 177 is rotated by the rotation of the stage 52. The cover member 177 is disposed to cover the second heat transfer unit 66 and the upper portion of the cold heat transfer body 165. The cover member 177 has a large diameter portion at an upper portion thereof and a small diameter portion at a lower portion thereof. A heat insulating structure 159 is disposed at an outer periphery of the cold heat transfer body 165. A heat insulating member 187 is disposed on the bottom surface of the second heat transfer body 66.

A magnetic fluid seal 181 is disposed between the fixed frame 180 and the small diameter portion of the cover member 177. A heater 182 for heating the magnetic fluid seal 181 is disposed near the magnetic fluid seal 181 of the fixed frame 180. A magnetic fluid seal 183 is disposed between the rotation shaft 70 and the base plate 191. A heater 184 for heating the magnetic fluid seal 83 is disposed near the magnetic fluid seal 183. The stage 52 can be rotated via the rotation shaft 70 in a state where the gap between the cover member 177 and the fixed frame 180 and the gap between the rotation shaft 70 and the base plate 191 are hermetically sealed with the magnetic fluid seals 81 and 83. Further, the magnetic fluid seals 181 and 183 can be heated by the heaters 182 and 184, so that it is possible to suppress the deterioration of the sealing performance or the occurrence of condensation due to the decrease in the temperature of the magnetic fluid. The other configurations of the stage device 150 are the same as those of the stage device 50 of the first embodiment.

In the present embodiment, since the cylindrical cold heat transfer body 165 is disposed below the stage 52 to surround the rotation shaft 70, the stage device 150 can be scaled down in size as in the first embodiment. Further, a volume for transferring cold heat can be secured even with the thin cold heat transfer body 165. Therefore, the outer diameter of the cold heat transfer body 165 can be reduced. Accordingly, space can be saved and the diameter of the magnetic fluid seal 181 can be reduced. In addition, ease of maintenance can be ensured.

<Other Applications>

The above-described embodiments are considered to be illustrative in all aspects and not restrictive. The above-described embodiments may be omitted, replaced, or changed variously without departing from the scope and the gist of the following claims.

Although the above-described embodiments have described the case of using the columnar cold heat transfer body or the cylindrical cold heat transfer body disposed to surround the rotation shaft, it is not limited thereto as long as the cold heat transfer body is disposed at a position spaced away from the rotation shaft.

Although the above-described embodiments have described the case where the present disclosure is applied to the sputtering film formation of the magnetic film used for the TMR element as an example, the present disclosure is not limited thereto as long as a uniform process is required at an extremely low temperature.

While certain embodiments have been described, these embodiments have been presented by way of example only and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

The invention claimed is:

1. A stage device for holding a substrate in a processing apparatus for processing the substrate, comprising:
   a stage configured to hold the substrate in a processing chamber;
   a stage rotating mechanism including a rotation shaft extending downward from a center of a bottom surface of the stage and a motor configured to rotate the stage via the rotation shaft; and
   a cold heat transfer mechanism including at least one cold heat transfer body that is fixedly disposed at a position spaced away from the rotation shaft below the stage and configured to transfer cold heat of a chiller, the cold heat transfer mechanism being disposed with a gap between the cold heat transfer mechanism and the stage,
   wherein the cold heat transfer mechanism is supported by a fixed frame disposed with a seal between the fixed frame and the rotation shaft, and further includes a stage-side heat transfer unit that is disposed to correspond to the stage with the gap therebetween, the at least one cold heat transfer body being connected to the stage-side heat transfer unit,
   wherein a heat insulating member is disposed on a bottom surface of the stage-side heat transfer unit.

2. The stage device of claim 1, further comprising:
   a cooling fluid supply mechanism configured to supply to the gap a cooling fluid for transferring cold heat of the cold heat transfer mechanism to the stage.

3. The stage device of claim 2, wherein the cooling fluid is a cooling gas.

4. The stage device of claim 1, wherein a comb-teeth shaped heat exchange portion is formed at the gap between the stage and the stage-side heat transfer unit.

5. The stage device of claim 1, wherein the at least one cold heat transfer body has a columnar shape and is disposed at a position eccentric from the rotation shaft.

6. The stage device of claim 5, wherein the at least one cold heat transfer body of the cold heat transfer mechanism includes two or more cold heat transfer bodies.

7. The stage device of claim 1, wherein the at least one cold heat transfer body has a cylindrical shape and is disposed to surround the rotation shaft.

8. The stage device of claim 1, wherein the motor of the stage rotating mechanism is a direct driving motor disposed to surround the rotation shaft.

9. The stage device of claim 1, wherein the stage is cooled to a temperature of −23° C. to −223° C.

10. A processing apparatus for processing a substrate comprising:
    a processing chamber accommodating a substrate;
    a stage device for holding a substrate in a processing apparatus for processing the substrate, the stage device configured to rotatably support the substrate in the processing chamber, the stage device comprising:
a stage configured to hold the substrate in a processing chamber,
a stage rotating mechanism including a rotation shaft extending downward from a center of a bottom surface of the stage and a motor configured to rotate the stage via the rotation shaft, and
a cold heat transfer mechanism including at least one cold heat transfer body that is fixedly disposed at a position spaced away from the rotation shaft below the stage and configured to transfer cold heat of a chiller, the cold heat transfer mechanism being disposed with a gap between the cold heat transfer mechanism and the stage; and
a processing mechanism configured to process the substrate in the processing chamber,
wherein the cold heat transfer mechanism is supported by a fixed frame disposed with a seal between the fixed frame and the rotation shaft, and further includes a stage-side heat transfer unit that is disposed to correspond to the stage with the gap therebetween, the at least one cold heat transfer body being connected to the stage-side heat transfer unit,
wherein a heat insulating member is disposed on a bottom surface of the stage-side heat transfer unit.

11. The processing apparatus of claim 10, wherein the processing mechanism includes a target for sputtering film formation, the target being disposed above the stage in the processing chamber.

12. The processing apparatus of claim 11, wherein the target is made of a material forming a magnetic film used for a tunneling magneto-resistance element.

\* \* \* \* \*